(12) United States Patent
Yang et al.

(10) Patent No.: US 7,145,207 B2
(45) Date of Patent: Dec. 5, 2006

(54) GATE STRUCTURE OF SEMICONDUCTOR MEMORY DEVICE

(75) Inventors: Hong-Seon Yang, Kyoungki-do (KR); Se-Aug Jang, Kyoungki-do (KR); Yong-Soo Kim, Kyoungki-do (KR); Kwan-Yong Lim, Kyoungki-do (KR); Heung-Jae Cho, Kyoungki-do (KR); Jae-Geun Oh, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/027,663

(22) Filed: Dec. 30, 2004

(65) Prior Publication Data

US 2006/0001115 A1    Jan. 5, 2006

(30) Foreign Application Priority Data

Jun. 30, 2004    (KR) .................. 10-2004-0050182

(51) Int. Cl.
*H01L 29/76*    (2006.01)
*H01L 29/94*    (2006.01)

(52) U.S. Cl. ............... 257/388; 257/412; 257/413; 257/E21.623; 438/652

(58) Field of Classification Search ............... 438/652, 438/653; 257/388, 412, 413, 750, E21.623, 257/E21.637
See application file for complete search history.

(56) References Cited

U.S. PATENT DOCUMENTS

2002/0086507 A1*    7/2002    Park et al. .................. 438/585

* cited by examiner

*Primary Examiner*—Hsien-Ming Lee
(74) *Attorney, Agent, or Firm*—Blakely Sokoloff Taylor & Zafman

(57) ABSTRACT

A gate structure of a semiconductor memory device capable of preventing a poly void generation by forming a hard mask and maintaining a hysteresis area within a certain value. The gate structure of the semiconductor memory device includes: a gate insulation layer formed on a semiconductor substrate; a gate electrode formed on the gate insulation layer, wherein the gate electrode is formed by stacking a polysilicon layer and a metal layer; and a hard mask formed on the gate electrode, wherein a hysteresis area between the hard mask and the gate electrode materials is a equal to or less than approximately $2 \times 10^{12}$ ° C.-dyne/cm$^2$.

4 Claims, 3 Drawing Sheets

GATE STRUCTURE OF SEMICONDUCTOR MEMORY DEVICE

FIELD OF THE INVENTION

The present invention relates to a semiconductor memory device; and more particularly, to a gate structure formed by stacking polysilicon, tungsten nitride and tungsten (W/WN/Poly) for preventing a poly void generation due to a mechanical stress between a gate hard mask and the gate structure.

DESCRIPTION OF RELATED ARTS

As for a gate structure for a word line (WL), a W/WN/Poly gate structure, i.e, a gate structure obtained by stacking polysilicon, tungsten nitride and tungsten, has been studied as a next generation structure. When fabricating a dynamic random access memory (DRAM) which is a semiconductor memory device, a self align contact (SAC) process is introduced to secure an overlay margin at a maximum extent during a subsequent contact process after forming the WL.

In order to secure a process margin at the SAC process, a gate hard mask with a thickness equal to or greater than a predetermined thickness should remain even after employing a process for forming a gate electrode. Furthermore, if a contact structure is a hole type, the WL and a bit line should be separated and an insulation layer with a thickness equal to or greater than a predetermined thickness should exist on the WL in order to prevent a damage of the WL during etching.

As for the W/WN/Poly gate structure, a tungsten layer has a characteristic that can be easily oxidized in an atmosphere of oxygen and thus, conditions of a deposition temperature and a deposition gas for depositing the hard mask are very limited.

In accordance with a conventional semiconductor device, the gate hard mask is formed as a nitride layer by employing a low temperature plasma deposition method as considering an oxidizing characteristic of W during a process for forming the gate electrode.

A low temperature plasma nitride layer used as the gate hard mask is very susceptible to thermal stress induced by a subsequent thermal process, thereby degrading a gate oxide integrity (GOI) characteristic of a gate oxide layer.

FIG. 1 is a diagram measuring reliability of a gate oxide layer when using a low temperature PE_SIN as a hard mask material and a gate electrode has a W/WN/Poly-Si structure and a WSix/Poly-Si structure, respectively. Especially, FIG. 1 illustrates a stress induced leakage current (SILC) as one of the methods for evaluating a reliability of a gate oxide layer to an area of a MOS capacitor.

Referring to FIG. 1, in case of the WSix/Poly-Si gate electrode, the SILC has a fixed value regardless of the area of the MOS capacitor, and thus the WSix/Poly-Si gate electrode is recognized to be very stable. Meanwhile, in case of a W/WN/Poly-Si gate electrode, a value of the SILC not only is relatively high compared to the Wsix/Poly-Si gate electrode but also increases as the area of the MOS capacitor increases. Accordingly, it is concluded that the W/WN/Poly-Si gate electrode is very weak to a mechanical stress of the hard mask.

FIG. 2 is a photograph of high resolution transmission electron microscopy (TEM) illustrating the surroundings of a gate oxide layer at a W/WN/Poly-Si gate electrode with a poor GOI property.

Referring to FIG. 2, if observing a cross-sectional view illustrating the W/WN/Poly-Si gate electrode with the poor GOI property through the photograph of high resolution TEM, a poly void with a size of approximately several nm is found between the polysilicon layer and the gate oxide layer. This poly void is located on an upper portion of the gate oxide layer and thus, the density of electric fields becomes dense at this void region. Therefore, the GIO property of the W/WN/Poly-Si gate electrode is degraded.

SUMMARY OF THE INVENTION

It is, therefore, an object of the present invention to provide a gate structure of a semiconductor memory device capable of preventing a poly void generation by forming a hard mask and maintaining a hysteresis area at a certain value.

In accordance with one aspect of the present invention, there is provided a gate structure of a semiconductor memory device, including: a gate insulation layer formed on a semiconductor substrate; a gate electrode formed on the gate insulation layer, wherein the gate electrode is formed by stacking a polysilicon layer and a metal layer; and a hard mask formed on the gate electrode, wherein a hysteresis area between the hard mask and the gate electrode materials is a size equal to or less than approximately $2 \times 10^{12}$ ° C.-dyne/$cm^2$.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions of preferred embodiments of the present invention will be provided with reference to the accompanying drawings.

Figure 1:
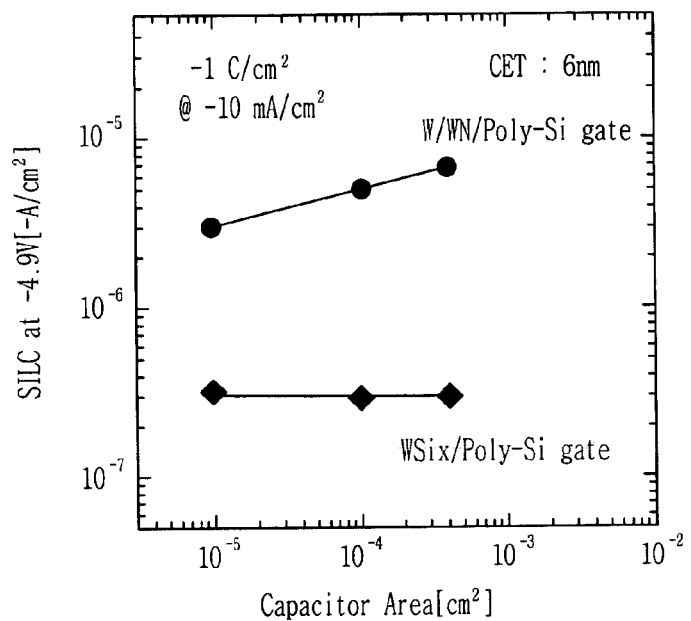
FIG. 1 is a diagram illustrating a stress induced leakage current (SILC) property in accordance with an area of a MOS capacitor for a gate electrode of a conventional semiconductor memory device.
Figure 2:
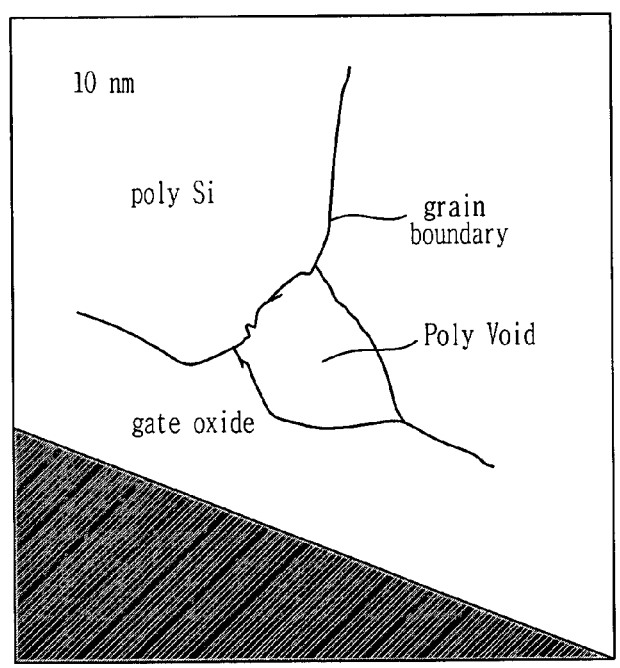
FIG. 2 is a diagram illustrating a poly void generation in a gate electrode of a conventional semiconductor memory device.
Figure 3:
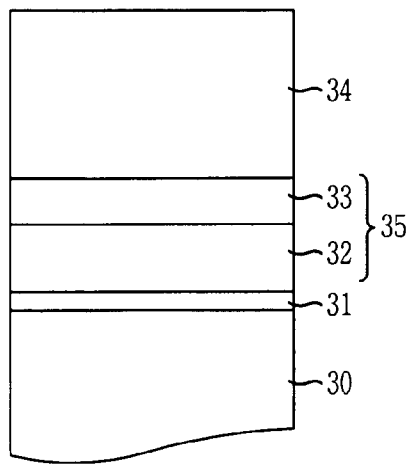
FIG. 3 is a cross-sectional view illustrating a gate electrode of a semiconductor memory device in accordance with the present invention.

FIG. 3 is a cross-sectional view illustrating a gate electrode of a semiconductor memory device in accordance with the present invention.

Referring to FIG. 3, for the semiconductor memory device in accordance with the present invention, a gate insulation layer 31 and a gate electrode 35 made of an oxide layer are formed on a silicon substrate 30. The gate electrode 35 is formed by stacking a polysilicon layer 32 and a metal layer 33. The metal layer 33 is made of a material selected from a group consisting of W, W/WN, TiN and TaN. Then, a gate hard mask 34 is formed on the gate electrode 35. The hard mask includes a material selected from a group consisting of PE_SIN, PE_TEOS and PE_SiN/PE_TEOS. In accordance with the present invention, a hysteresis area is formed between the hard mask and the gate electrode materials with a size equal to or less than approximately $2 \times 10^{12}$ °C.-dyne/cm$^2$.

Figure 4:
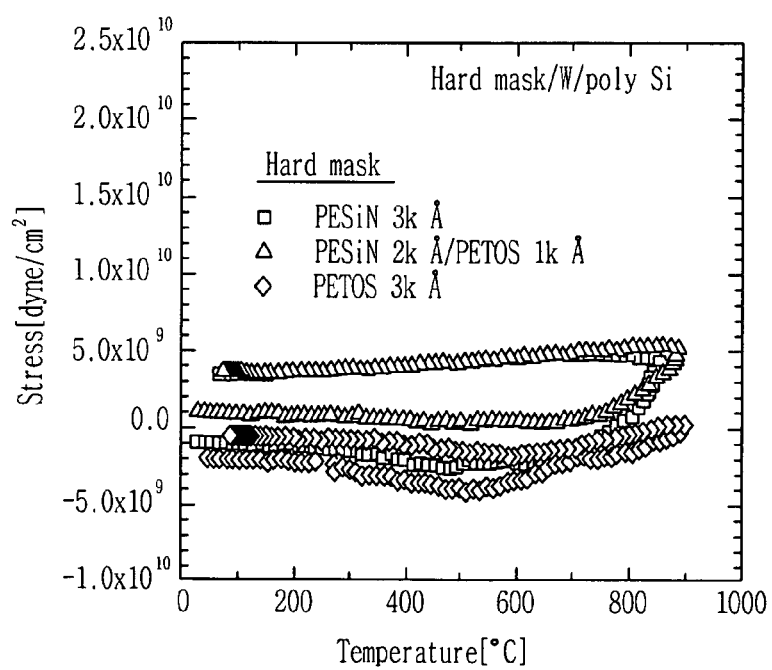
FIG. 4 is a diagram illustrating a stress hysteresis according to each hard mask material for a gate structure of a semiconductor memory device in accordance with the present invention.

FIG. 4 is a diagram illustrating a stress hysteresis measurement result at a temperature ranging from room temperature to approximately 900° C. for the gate electrode 35 including the gate hard mask 34 shown in FIG. 3.

Referring to FIG. 4, for a method to measure hysteresis, a gate electrode provided with a structure shown in FIG. 3 is formed on a bare wafer with a size of approximately 8 inches. Then, at an atmosphere of nitrogen, the temperature is artificially raised from a room temperature to approximately 900° C. by approximately 1.83° C. per minute and then, the temperature is dropped again to a room temperature by approximately 2° C. per minute. Therefore, a degree of bending of the wafer is obtained by using a scanning beam method, thereby measuring hysteresis.

As shown in FIG. 4, the hysteresis area is obtained by integrating each curved area which appears during a hysteresis measurement with use of the scanning beam method. More specifically, each of the curved areas appears respectively while the temperature is rising from a room temperature to approximately 900° C. and decreasing to a room temperature again.

Referring to FIG. 4, a difference in the hysteresis area is illustrated depending on kinds of the hard mask such as Plasma Enhanced Silicon Nitride (PE_SiN), Plasma Enhanced Tetraethylorthosilicate (PE_TEOS) and PE SiN/PE TEOS.

Figure 5:
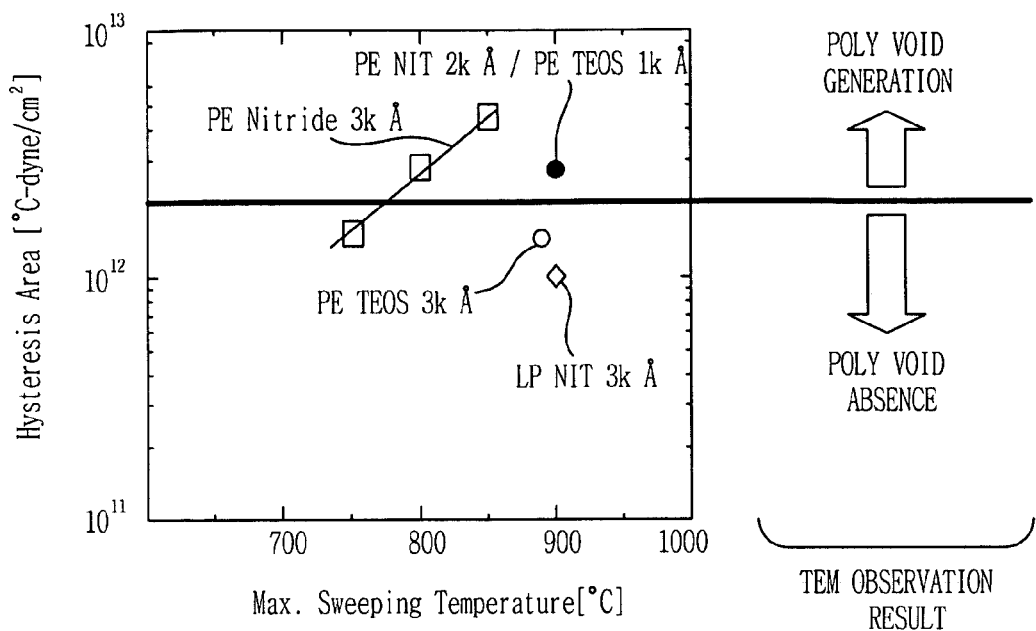
FIG. 5 is a diagram illustrating a relationship between a hysteresis area and a poly void generation for a gate structure of a semiconductor memory device in accordance with the present invention.

FIG. 5 is a graph illustrating a hysteresis area according to a maximum sweeping temperature when measuring the hysteresis with respect to each hard mask material by using the above method shown in FIG. 4. Furthermore, FIG. 5 illustrates a poly void generation observed by a photograph of high resolution TEM analysis in case of using each hard mask material.

Referring to FIG. 5, when observing the hysteresis area and the TEM measurement result, if the hysteresis area is equal to or greater than approximately $2 \times 10^{12}$ °C.-dyne/cm$^2$ to each mask material, a poly void is generated at the gate structure of the hard mask/W/WN/Poly-Si and if the hysteresis area is equal to or less than approximately $2 \times 10^{12}$ °C.-dyne/cm$^2$ to each mask material, the poly void is not generated.

Figure 6:
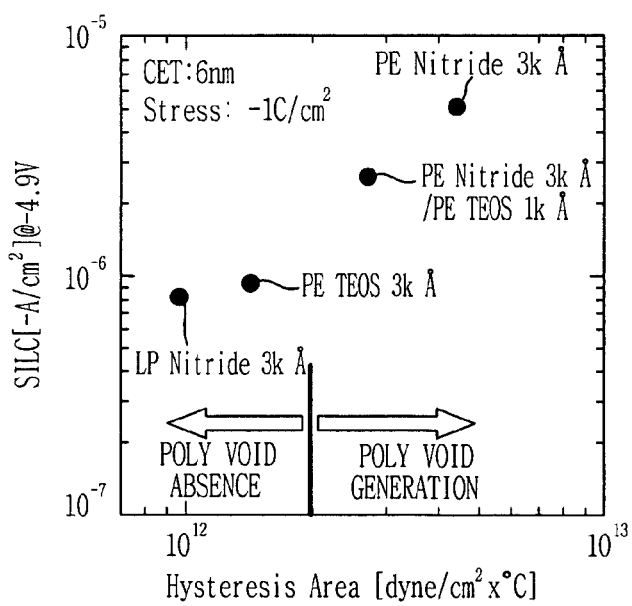
FIG. 6 is a diagram illustrating a correlation of a hysteresis area, a poly void generation and a stress induced leakage current (SILC) for a gate structure of a semiconductor memory device in accordance with the present invention.

FIG. 6 illustrates a correlation of the hysteresis area, the poly void and the SILC. Referring to FIG. 6, if having a hysteresis area equal to or greater than approximately $2 \times 10^{12}$ °C.-dyne/cm$^2$ in which the poly void is observed, the GOI property is deteriorated and if having a hysteresis area equal to or less than approximately $2 \times 10^{12}$ °C.-dyne/cm$^2$, the GOI property is excellent.

The present invention can be applied not only to the gate electrode of the hard mask/W/WN/Poly-Si structure but also to a structure in which a metal material such as W, TiN or TaN is deposited on the polysilicon layer and then, the hard mask is formed thereon.

The method for forming a gate electrode in accordance with the present invention controls the hysteresis area in a size equal to or less than approximately $2 \times 10^{12}$ °C.-dyne/cm$^2$. Therefore, a poly void generation is prevented by using the method for forming a gate electrode and thus, a reliable property of the gate oxide layer can be obtained.

The present application contains subject matter related to the Korean patent application No. KR 2004-0050182, filed in the Korean Patent Office on Jun. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A gate structure of a semiconductor memory device, comprising:
    a gate insulation layer formed on a semiconductor substrate;
    a gate electrode formed on the gate insulation layer, wherein the gate electrode is formed by stacking a polysilicon layer and a metal layer; and
    a hard mask formed on the gate electrode, wherein a hysteresis area between the hard mask and the gate electrode is a size equal to or less than approximately $2 \times 10^{12}$ °C.-dyne/cm$^2$.

2. The gate structure of claim 1, wherein the metal layer for the gate electrode includes a material selected from a group consisting of W, W/WN, TiN and TaN.

3. The gate structure of claim 1, wherein the hard mask includes one selected from a group consisting of Plasma Enhanced silicon nitride (PE$_{13}$SiN), Plasma Enhanced Tetraethylorthosilicate (PE_TEOS) and PE_SiN/PE_TEOS.

4. The gate structure of claim 1, wherein the hysteresis area is a value measured at a temperature ranging from room temperature to approximately 900° C. at a bare wafer with a size of approximately 8 inches.

* * * * *